United States Patent
Miwa

(10) Patent No.: US 8,742,783 B2
(45) Date of Patent: Jun. 3, 2014

(54) CONTACTOR

(75) Inventor: Kazuiku Miwa, Obu (JP)

(73) Assignee: NGK Insulators, Ltd., Nagoya (JP)

( * ) Notice: Subject to any disclaimer, the term of this patent is extended or adjusted under 35 U.S.C. 154(b) by 265 days.

(21) Appl. No.: 12/966,010

(22) Filed: Dec. 13, 2010

(65) Prior Publication Data

US 2011/0156737 A1 Jun. 30, 2011

(30) Foreign Application Priority Data

Dec. 24, 2009 (JP) ................................. 2009-292642

(51) Int. Cl.
  *G01R 31/20* (2006.01)
(52) U.S. Cl.
  USPC . 324/754.14; 324/537; 324/558; 324/754.01; 324/754.03; 324/754.12; 324/758
(58) Field of Classification Search
  USPC ............. 324/754.14, 754.01, 754.03, 754.12, 324/537, 558, 758
  See application file for complete search history.

(56) References Cited

U.S. PATENT DOCUMENTS

| | | | | |
|---|---|---|---|---|
| 4,980,637 A | * | 12/1990 | Huff et al. ................ | 324/755.09 |
| 5,417,687 A | * | 5/1995 | Nardella et al. ................ | 606/32 |
| 7,403,029 B2 | * | 7/2008 | Chong et al. ............. | 324/755.05 |
| 7,616,016 B2 | * | 11/2009 | Eldridge et al. ......... | 324/756.03 |
| 7,649,369 B2 | * | 1/2010 | Okumura et al. ........ | 324/754.03 |
| 7,893,704 B2 | * | 2/2011 | Gleason et al. .......... | 324/755.01 |
| 2004/0065980 A1 | * | 4/2004 | Osaki ............................ | 264/340 |
| 2005/0032252 A1 | * | 2/2005 | Kohno et al. ................... | 438/14 |
| 2006/0244470 A1 | * | 11/2006 | Shinde et al. ................ | 324/754 |
| 2013/0162265 A1 | * | 6/2013 | Beccavin et al. ............ | 324/558 |

FOREIGN PATENT DOCUMENTS

| | | | |
|---|---|---|---|
| JP | 61-132775 U | | 8/1986 |
| JP | 04-363671 A1 | | 12/1992 |
| JP | 07-043384 A1 | | 2/1995 |
| JP | 07-209335 A1 | | 8/1995 |
| JP | 2001033486 | * | 2/2001 |
| JP | 2001-266983 A1 | | 9/2001 |
| JP | 2003-344450 A1 | | 12/2003 |
| JP | 2009-025026 A1 | | 2/2009 |

OTHER PUBLICATIONS

Japanese Office Action dated Apr. 16, 2013 (with English translation).

* cited by examiner

*Primary Examiner* — Tung X Nguyen
*Assistant Examiner* — Giovanni Astacio-Oquendo
(74) *Attorney, Agent, or Firm* — Burr & Brown, PLLC

(57) ABSTRACT

A contactor is brought into contact with and separated from an electrode formed on a test target, and includes an elastic member that overlaps with a conductive member having a contact and which urges the contact in a pressing direction. The elastic member is fixed at a predetermined fixed position in a state projecting to the outside of a main body member and the conductive member is electrically connected from the outside of a housing of the main body member of the contactor.

8 Claims, 8 Drawing Sheets

CONTACTOR

BACKGROUND OF THE INVENTION

1. Field of the Invention

The present invention relates to a contactor.

2. Description of the Related Art

As a prior-art contactor, a device provided with a spring and a plunger as a contact inside a conductive tube as a cylindrical main body member, in which the plunger is pressed by the spring onto an electrode as a test target so as to test an electric connection state of the test target is proposed (See Japanese Unexamined Patent Application Publication No. 2003-344450, for example). In this contactor, by drilling a through hole on the blocked side of the conductive tube, intrusion of dusts can be suppressed. Also, as a contactor, a device in which a connection electrode having flexibility and having one end side in contact with an electrode as a test target and the other end side connected to a terminal of a tester is formed projecting from both faces of a main body member so as to test an electric connection state of the test target is proposed (See Japanese Unexamined Patent Application Publication No. 2009-25026, for example). In this contactor, one end of a connection electrode is recessed from the surface of the main body member, while the other end is constituted to be present within a holding hole of the main body member so that durability can be improved. Also, as a contactor, a device provided with a contact piece in contact with an electrode as a test target, another contact piece in contact with a terminal electrode of a wiring board, and a ring portion that electrically connects these contact pieces is proposed (See Japanese Unexamined Patent Application. Publication No. 2001-266983, for example). This contactor can realize a reduced cost and a longer life.

SUMMARY OF THE INVENTION

However, with the contactor described in Japanese Unexamined Patent Application Publication No. 2003-344450, though intrusion of dusts is suppressed by drilling the through hole on the blocked side, since the plunger slides inside the cylinder, metal powders can be easily generated, and tests might be hindered by sliding inhibition, contamination of objects to be tested and the like caused by the metal powders. There is also a problem that if the pressing direction to the test target and the axial direction are inclined, more biased sliding can occur, which might cause similar nonconformity. With the contactor described in Japanese Unexamined Patent Application Publication No. 2009-25026, since a plurality of connection electrodes are provided between a probe in contact with the object to be tested and a tester, accuracy in the height direction of the connection electrode needs to be further improved in order to obtain stable electric connection, which might result in difficulty in manufacture. Also, formation of the shape of the connection electrode can take labor. Also, with the contactor described in Japanese Unexamined Patent Application Publication No. 2001-266983, conductivity and a pressing force might be given by a member of the contact piece, and if a member with priority given to conductivity (such as copper, copper alloy and the like, for example) is used, durability to generate the pressing force is poorer than that of the member with priority given to the pressing force (such as spring steel, stainless spring steel and the like, for example), and stable durability of electric connection requiring conductivity might become insufficient. As mentioned above, a contactor that can sufficiently obtain electric connection, has sufficient mechanical durability and can easily test electric characteristics of a test target has been in demand.

The present invention was made in view of the above problems and has a main object to provide a contactor that can test electric characteristics of a test target more easily.

The present invention has employed the following means in order to achieve the above-described object.

According to the present invention, a contactor for test that is brought into contact with/separated from an electrode formed on a test target and tests electrical characteristics of an electric circuit having the electrode, includes:

one or more conductive members having a contact brought into contact with/separated from the electrode formed and having flexibility and conductivity;

an elastic member that overlaps with the conductive member at the contact and urges the contact in a predetermined pressing direction; and a main body member to which the elastic member is fixed in a state projecting to the outside of a housing at a predetermined fixed position and to which the conductive member is electrically connected from the outside of the housing.

In this contactor, an elastic member that urges the contact in a pressing direction is fixed at a predetermined fixed position, and the conductive member on which the contact is formed is electrically connected thereto. This conductive member and the elastic member are overlapped at the contact, and the elastic member urges the contact in the pressing direction. By forming the conductive member and the elastic member by separate materials as above, a combination of an urging force and conductivity of the contact can be freely set more favorably. Also, as compared with those in which the conductive member and the elastic member slide inside the main body member, for example, generation of a foreign substance can be further suppressed. Therefore, electric characteristics of a test target can be tested more easily. Here, the "predetermined pressing direction" may be a direction where the test target is arranged. Also, the "predetermined fixed position" may be any position in the main body member as long as the elastic member can urge the contact at that position.

According to the contactor of the present invention, the conductive member is formed on a wiring board having flexibility and the contact is formed on a test face, which is a face on the side where the test target is arranged; and the elastic member overlaps with the conductive member on a face on the side opposite to the test face and urges the contact from the back side of the contact in the pressing direction. Also, the conductive member may be formed on the wiring board having a slit portion disposed in accordance with the contact.

According to the contactor of the present invention, the conductive member may be electrically connected to the main body member by a spring electrode having conductivity. According to the contactor of the present invention, the elastic member may be fixed to the main body member at a position offset from the contact with respect to the pressing direction as the fixed position. Also, in the contactor of the present invention, the elastic member may be a spring fixed to the main body member on the side opposite to the side to which the conductive member is electrically connected or fixed to the main body member on the same side as the side to which the conductive member is electrically conducted. Also, in the contactor of the present invention in a mode in which the conductive member is formed on a wiring board having a slit portion, the elastic member may be a spring having a sawtooth portion in which slits are formed corresponding to the slit portion disposed in accordance with the contact. This spring may be a leaf spring. Alternatively, in the contactor of the present invention, the elastic member may be a hollow member capable of containing a fluid inside. The "fluid" here includes a gas such as air and nitrogen or a liquid such as water and oil. At this time, the conductive member may be wiring formed on the surface of the elastic member. In the contactor of the present invention, the elastic member may be a solid member not having a hollow portion.

DETAILED DESCRIPTION OF THE INVENTION

Figure 1:
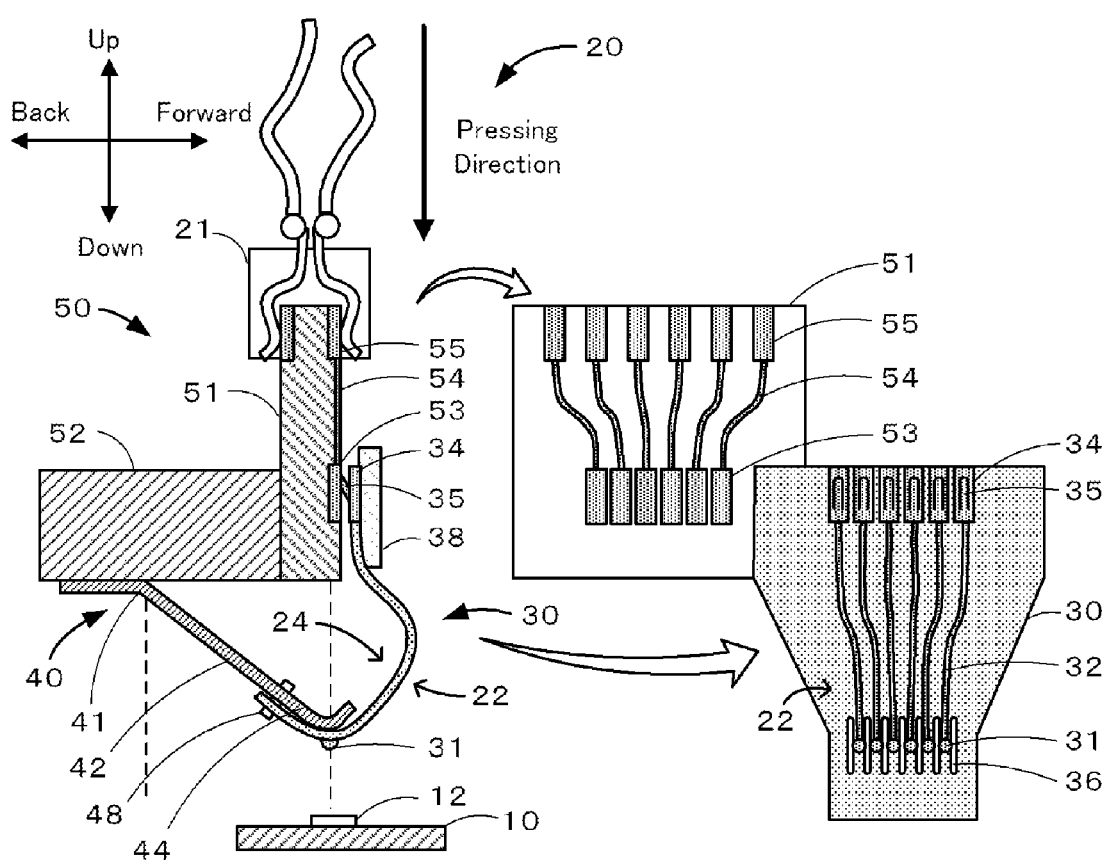
FIG. 1 is a configuration diagram illustrating an outline of a configuration of a contactor 20, which is an embodiment of the present invention.
Figure 2:
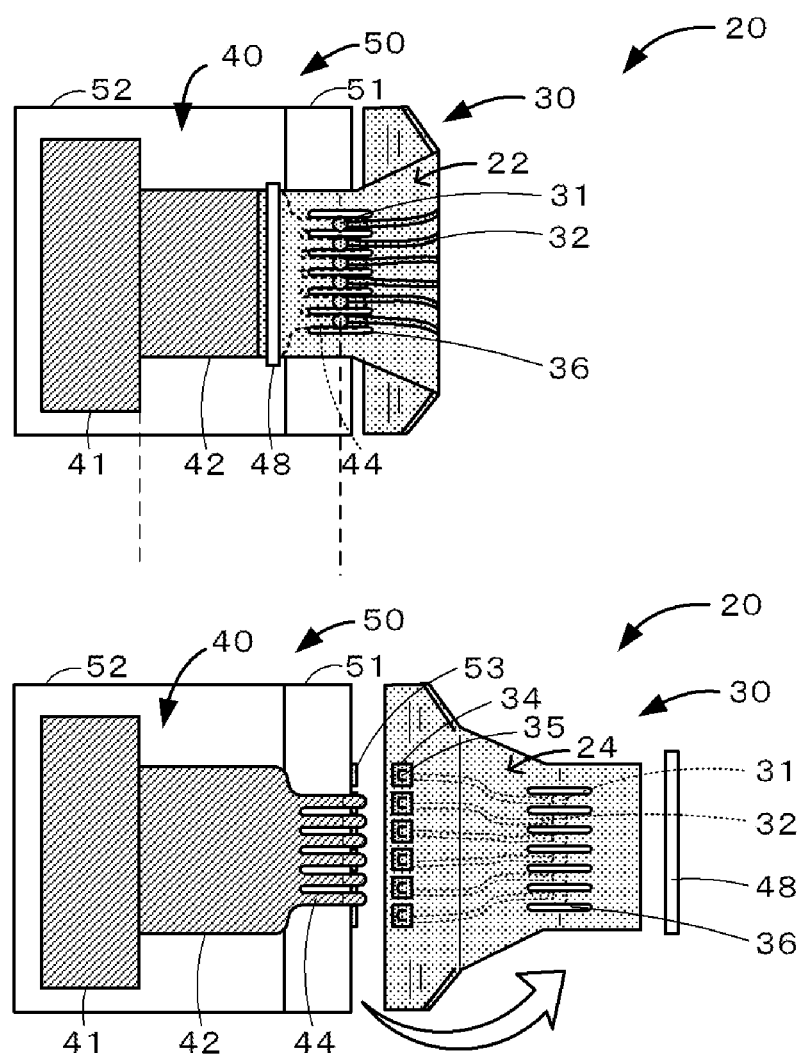
FIG. 2 is an explanatory diagram of a lower face side of the contactor 20.
Figure 3:
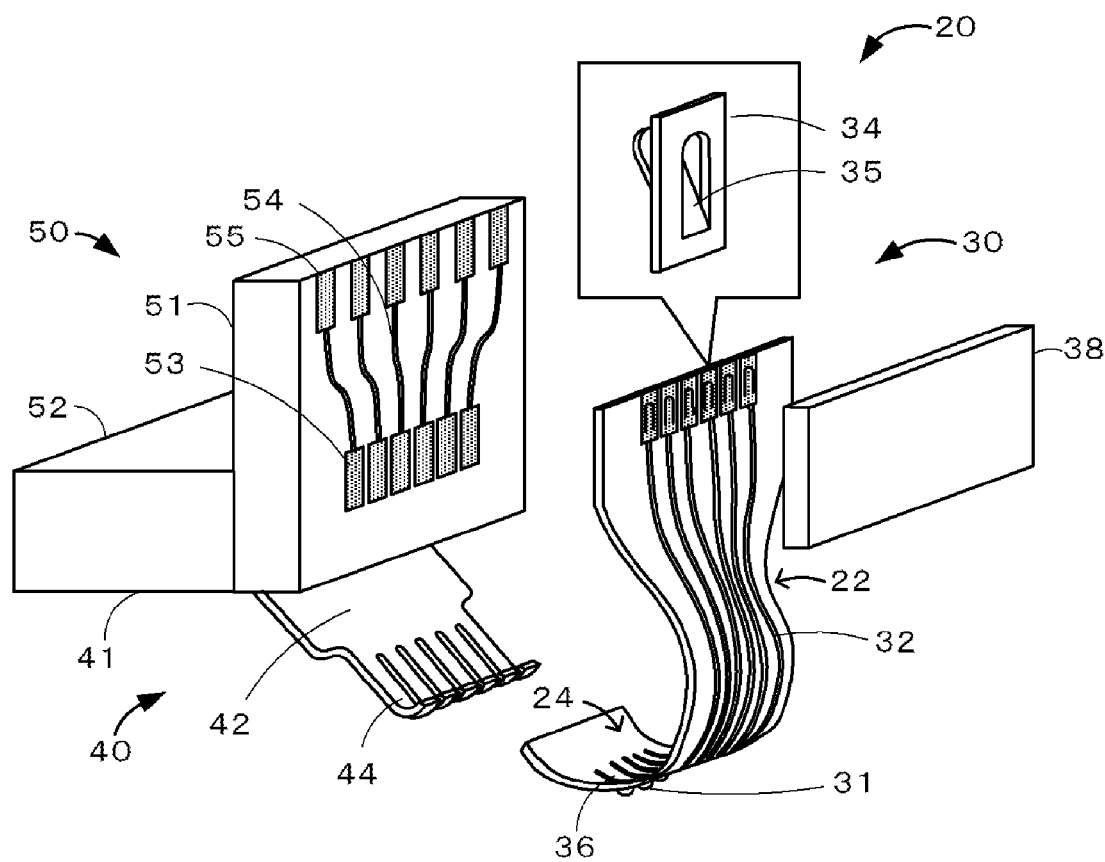
FIG. 3 is an exploded perspective view of the contactor 20.

Subsequently, a mode for carrying out the present invention will be described using the attached drawings. FIG. 1 is a configuration diagram illustrating an outline of a configuration of a contactor 20, which is an embodiment of the present invention, FIG. 2 is an explanatory diagram of a lower face side of the contactor 20, and FIG. 3 is an exploded perspective view of the contactor 20. The contactor 20 of this embodiment is constituted as a contactor for testing electric characteristics (connection characteristics and the like) of an electric circuit having an electrode 12 by being brought into contact with/separated from the electrode 12 formed on a test target 10 such as a connector, for example. This connector 20 includes a flexible printed circuit board (FPC) 30 as a wiring board, an elastic member 40 that urges the FPC 30 in a predetermined pressing direction, and a main body member 50 that electrically connects the FPC 30 and fixes the elastic member 40.

The FPC 30 is covered by a resin having insulation and flexibility, and board wires 32 as a plurality of conductive members having flexibility and conductivity are formed inside thereof. In the FPC 30, contacts 31 are formed on the side where the test target 10 is arranged (a lower-end side in FIG. 1), while spring electrodes 34 electrically connected to the main body member 50 are formed on the main body member 50 side (an upper end side in FIG. 1). In the board wire 32, the contact 31 is formed at one end thereof, while the spring electrode 34 is formed on the other end. This FPC 30 has its outline formed so that the width is made smaller as it goes from the spring electrode 34 side toward the contact 31 side, and the contacts 31 are formed with a pitch smaller than that of the spring electrodes 34. Also, in the FPC 30, slits 36 as penetrating grooves are formed adjacently to each of the contacts 31. That is, the board wire 32 is formed on the FPC 30 having the slits 36 disposed in accordance with the contacts 31. In this FPC 30, the spring electrode 34 side as the one end side is flied to the main body member 50 by a fixing plate 38, while the contact 31 side as the other end side is fixed to the elastic member 40 by a fixing member 48. In this contactor 20, the FPC 30 is fixed, and electric connection between the FPC 30 and the main body member 50 is realized by sandwiching the FPC 30 by the main body member 50 and the fixing plate 38 so as to fix the fixing plate 38. Thus, by removing the fixing plate 38, the FPC 30 can be easily removed.

Figure 4:
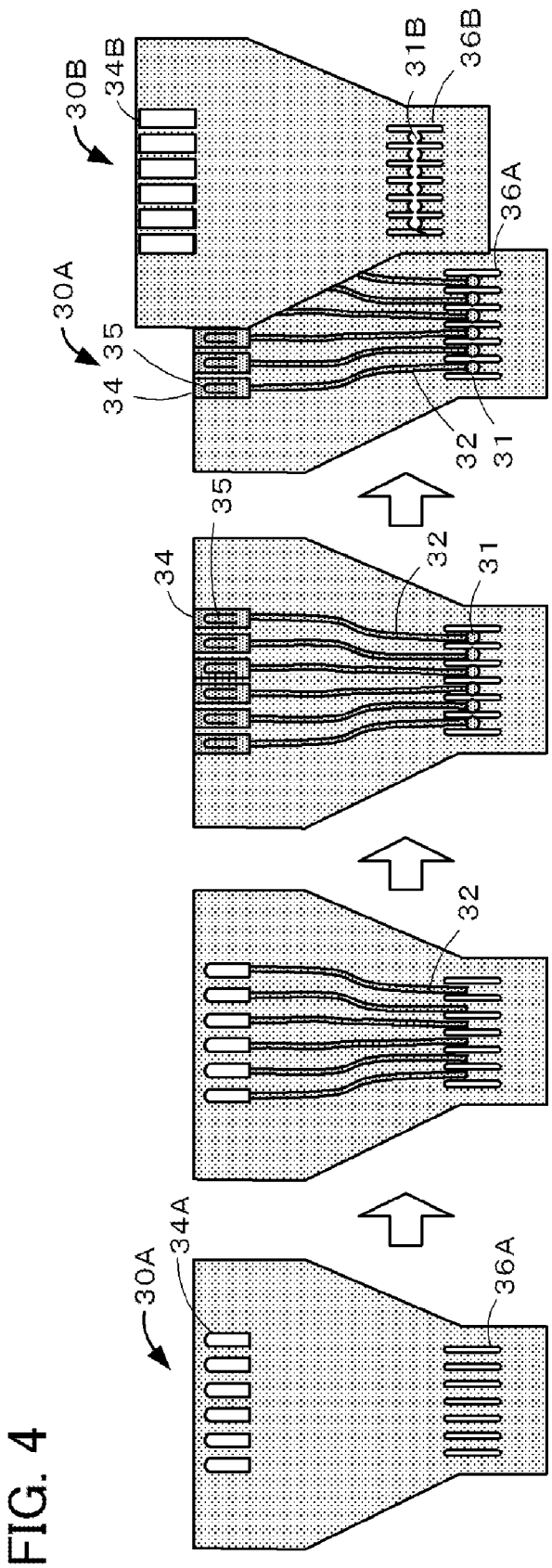
FIG. 4 is an explanatory diagram of manufacture of an FPC 30.

Here, a manufacturing method of the FPC 30 will be described. FIG. 4 is an explanatory diagram of a manufacture of the FPC 30. A covering member of the FPC 30 is not particularly limited as long as it is sheet like, having flexibility and insulation, and organic compounds such as polyimide, polyethylene terephthalate, rubber and the like can be cited. The thickness of this covering member is preferably 25 μm or more and 1 mm or less and more preferably 25 μm or more and 50 μm or less. First, on a first member 30A whose outline is formed so that the width on the contact 31 side is smaller, a plurality of connection-portion windows 34A into which connection portions 35 are inserted and a plurality of slits 36A as penetrating grooves disposed adjacently to the contacts 31 are worked (left end in FIG. 4). This first member 30A is a covering member on the opposite face 24 side, and pear-skin working may be added to the face on the side in contact with the elastic member 40. Subsequently, on the surface of the first member 30A, the board wires 32 are formed (second from the left in FIG. 4). In order to form the board wires 32, a metal foil may be used or electrocasting or printing of a metal material paste may be used. Subsequently, the spring electrodes 34 are bonded to one end of the board wires 32, and the contacts 31 are formed on the other end side (third from the left in FIG. 4). The above-described materials can be used as appropriate for materials and the like of the contact 31 and the spring electrode 34. Then, on the first member 30A on which the contacts 31, the board wires 32, and the spring electrodes 34 are formed, a second member 30B is bonded so as to complete the FPC 30. The second member 30B is a covering member on the test face 22 side, and connection windows 34B through which the spring electrodes 34 are exposed, contact windows 31B through which the contacts 31 are exposed, and slits 36B as penetrating grooves are disposed thereon. In this way, the FPC 30 with flexibility in which the board wires 32 are not exposed to the outside, the contacts 31 are exposed on the test face 22 side, and the connection portions 35 are exposed on the opposite face 24 side can be manufactured.

The contacts 31 are formed in accordance with an arrangement interval of the electrodes 12 and brought into contact with/separated from the electrodes 12 and are formed projecting on the test face 22 side, which is a face on the side where the test target 10 is arranged. For the contact 31, precious metals such as Pd, Pt, and Ag or conductive materials such as Cu and Ni can be used, for example, and a highly conductive and hard material is preferably used since electrical contact with the electrode 12 is preferable, and the precious metal, for example, is more preferable. This contact 31 may be manufactured by the same material as that of the board wire 32, may be formed by a different material, or may be coated with the precious metal or the like on the surface even if the same material is used. The one in which Au plating (0.76 μm or less) is applied to a Ni base (3 μm or less or the like) or the one a Pd alloy plating (0.3 μm or less or the like) is applied to the Ni base (3 μm or less or the like) is preferable. The material of the board wire 32 preferably has relatively high flexibility and conductivity and abundantly exists as resources and may be formed by Cu or a Cu alloy, for example. If a foil is used, the thickness can be 12 μm or more and 0.1 mm or less and a range of 12 μm or more and 50 μm or less is preferable. Also, the board wire 32 may be formed by a paste for screen printing such as Ag, and in this case, the thickness can be 10 μm or less. The spring electrode 34 is a member that electrically connects to the main body member 50 and has the connection portion 35 formed in the inverted U-shape (See FIG. 3). This connection portion 35 is inclined to the main body member 50 side and functions as a leaf spring having conductivity and flexibility so as to perform electrical connection between the contact 31 and the main body member 50. The spring electrode 34 may be formed by Cu or a Cu alloy, for example. If a foil is used, the thickness can be 12 μm or more and 0.1 mm or less, and a range of 12 μm or more and 50 μm or less is preferable.

The elastic member 40 is fixed to the main body member 50 on the side different from the side to which the FPC 30 is electrically connected and is constituted as a leaf spring that overlaps with the board wire 32 at the contact 31 and urges the contact 31 in the pressing direction. The elastic member 40 overlaps with the FPC 30 on the opposite face 24, which is a face on the side opposite to the test face 22 of the FPC 30 and urges the contact 31 from the back side of the contact 31 in the pressing direction. The pressing direction may be a direction in which the test target 10 is arranged. This elastic member 40 is preferably formed by a material with a stronger urging force and higher spring durability as compared with the FPC 30 (the board wire 32 and the like) and is preferably formed by iron, stainless, engineering plastic and the like, for example. Also, the elastic member 40 may be coated with an insulating member (such as an insulating resin, for example) on the surface, considering the insulation, rust-prevention treatment may be applied, or pear-skin working may be added in order to ensure friction against the FPC 30. This elastic member 40 can have the thickness of 50 μm or more and 0.5 mm or less, and the thickness can be selected in accordance with Young's modulus of the material, a spring set dimension and the like.

This elastic member 40 includes a fixing portion 41 fixed to the main body member 50, a plate-shaped portion 42 connected to the fixing portion 41 and formed with inclination to the lower part of FIG. 1, and a saw-tooth portion 44 that is formed at the distal end of the plate-shaped portion 42 and urges the contacts 31 (See FIGS. 2 and 3). The fixing portion 41 is, as shown in FIG. 2, a rectangular plate-shaped body and is fixed to the main body member 50 with a position offset from the contacts 31 with respect to the pressing direction as a fixed position. In this contactor 20, the distal ends of the saw-tooth portions 44 are moved drawing an arc with the fixing portion 41 as a fulcrum with respect to the vertical movement. Also, the fixing portion 41 is fixed to the main body member 50 on the side different from the side to which the FPC 30 is electrically connected. Thus, in the contactor 20, the FPC 30 and the elastic member 40 form a contact portion substantially in the U-shape in contact with the electrode 12. This elastic member 40 has slits formed in accordance with the slits 36 disposed in accordance with the contacts 31. That is, the elastic member is formed as a leaf spring having the saw-tooth portions 44 in which slits are formed in accordance with the contacts 31. In this contactor 20, since each of the saw-tooth portions 44 urges each of the contacts 31 adjacent to the slits 36 from the back side thereof, they can urge each contact 31 with freedom in the vertical direction for each contact 31. The distal end of the saw-tooth portion 44 is formed with roundness toward the main body member 50 side so as to prevent damage or the like of the covering member on the opposite face 24 of the FPC 30. Also, substantially in the middle of the plate-shaped portion 42 and the saw-tooth portion 44, a fixing member 48 that fixes the FPC 30 and the elastic member 40 by sandwiching the distal end of the FPC 30 is disposed. Thus, by removing the fixing member 48, the FPC 30 can be removed easily. This fixing member 48 is preferably disposed at a position closer to the contact 31, considering a wiping effect of the contact 31, which will be described later in detail. In FIG. 1, the fixing member 48 is disposed on the fixing portion 41 side with respect to the contact 31, but the fixing member 48 may be disposed on the distal end side of the saw-tooth portion 44 with respect to the contact 31.

The main body member 50 is constituted as a member that fixes the elastic member 40 and also electrically connects the FPC 30. The main body member 50 is constituted by a main body board 51, which is a plate-shaped body electrically connected to a tester, not shown, that detects an electrical connection state of the electrode 12 and an auxiliary board 52, which is a plate-shaped body that is disposed on the main body board 51 and fixes the elastic member 40. In this main body member 50, the elastic member 40 is fixed in a state projecting to the outside of a housing of the main body member 50 and is electrically connected to the FPC 30 from the outside of the housing of the main body member 50. In this main body member 50, the auxiliary board 52 is disposed in a direction orthogonal to the main body board 51. On the main body board 51, a plurality of first connection electrodes 53 formed at the center part in accordance with the spring electrodes 34, main body wires 54 connected to each of the first connection electrodes 53, and second connection electrodes 55 connected to each of the main body wires 54 and connected to the tester through a connector 21 are formed. On this main body board 51, each electrode is disposed so that the pitch of the second connection electrodes 55 is larger than that of the first connection electrodes 53. Thus, even if the contacts 31 have a smaller pitch, the connector 21 does not have to correspond to this small pitch but can be made in a larger size.

Figure 5:
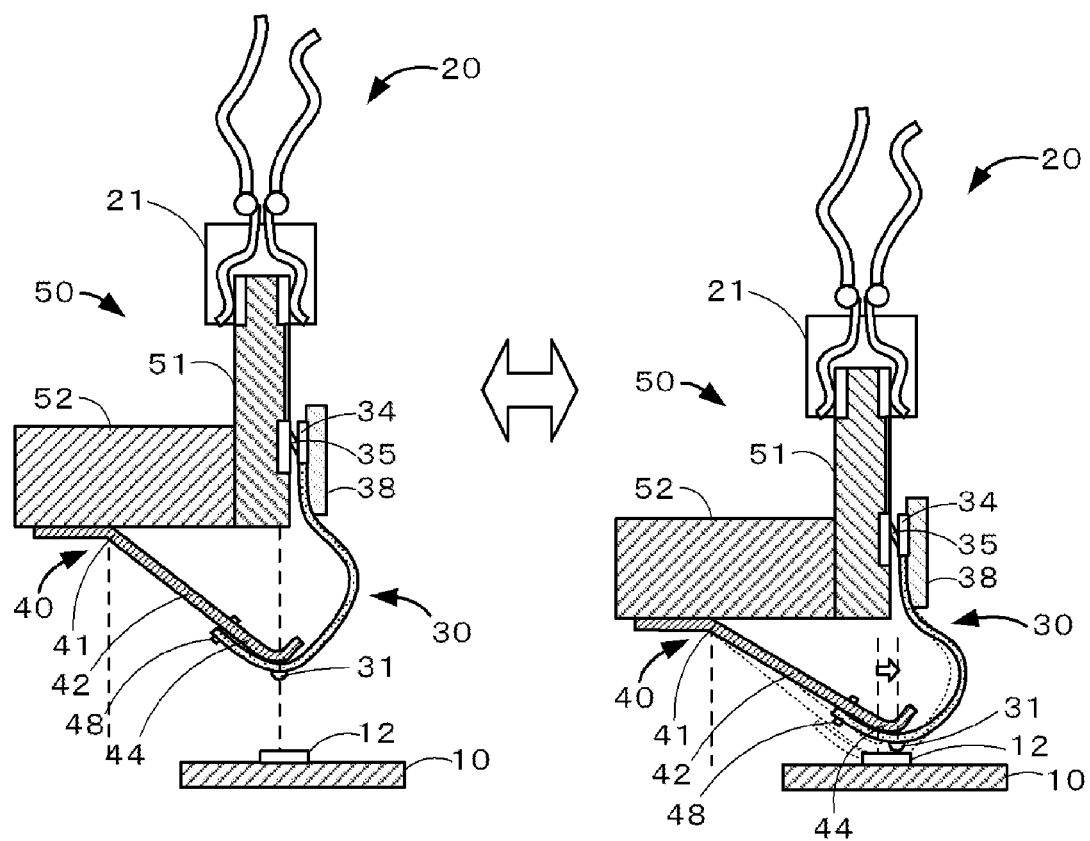
FIG. 5 is an explanatory diagram for explaining an operation of the contactor 20.

Subsequently, an operation of the contactor 20 constituted as above will be described. FIG. 5 is an explanatory diagram for explaining the operation of the contactor 20. This contactor 20 is fixed to a connector tester, not shown, and used when electric connection of the electrode 12 disposed on the test target 10 is tested. The connector tester has a portion that fixes the contactor 20 capable of moving in a vertical direction (pressing direction) with respect to the test target 10 and is constituted capable of bringing into contact/separating the contact 31 of the contactor 20 with/from the electrode 12 of the test target 10. Also, the contactor 20 is electrically connected to the tester, not shown, through the connector 21 and is constituted to detect the electric connection of a circuit of the test target 10 by supplying an electric signal from this tester in a state in which the contact 31 of the contactor 20 is in contact with the electrode 12 of the test target 10. When a test of the test target 10 is started, as shown in the left figure in FIG. 5, the contactor 20 is moved in the pressing direction. Then, the contact 31 is brought into electrical contact with the electrode 12. At this time, the contactor 20 is continuously moved toward the test target 10 side. Then, as shown in the right figure in FIG. 5, the FPC 30 fixed by the fixing plate 38 and the fixing member 48 flexibly moves following the saw-tooth portion 44. Also, by a high urging force of the saw-tooth portion 44 of the elastic member 40, the contact 31 is kept in a state in contact with the electrode 12. Also, since the fixing portion 41 is located at a position offset from the contact 31 with respect to the pressing direction, the contact 31 moves drawing an arc. In this way, with movement of the contactor 20 in the pressing direction, the contact 31 moves over the electrode 12 while being offset with respect to the pressing direction, and an influence of electric resistance of an oxidized film or the like formed on the surface of the electrode 12 can be removed (this is also called the wiping effect), and the test of the test target 10 is facilitated. Moreover, since each of the contacts 31 has freedom in the height direction by the slits 36, variation of the plurality of electrodes 12 in the height direction can be easily absorbed. By repeating the test of the test target 10, contacts 31 might be deteriorated, but by removing and replacing the FPC 30, a test can be conducted efficiently.

In the contactor 20 of this embodiment described above in detail, to the main body member 50, the elastic member 40 that urges the contact 31 in the pressing direction is fixed by the fixing portion 41 at a predetermined fixed position offset from the contact 31 in the pressing direction. Also, the FPC 30 on which the contacts 31 are formed is electrically connected to the main body member 50. And the FPC 30 and the elastic member 40 are overlapped with each other on the back side of the contacts 31, and the contacts 31 are urged by the elastic member 40 in the pressing direction. In this way, by forming the FPC 30 and the elastic member 40 by different materials, respectively, a combination of the urging force on the contacts 31 and the conductivity can be freely set favorably. Therefore, the electric characteristics of the test target can be tested more easily. Also, as compared with those in which the conductive member and the elastic member slide inside main body member, for example, generation of a foreign substance can be further suppressed.

Also, the board wires 32 (conductive member) are formed on the wiring board (FPD 30) having flexibility, the contacts 31 are formed on the test face 22, and the elastic member 40 overlaps with the FPC 30 on the opposite face 24 and urges the contacts 31 from the back of the contacts 31 side in the pressing direction. Thus, the conductive member can be formed by a simple structure of the wiring board, and electrical characteristics of the test target can be tested more easily. Moreover, the board wires 32 are formed on the FPC 30 having slits 36 disposed in accordance with the contacts 31, and even if the electrodes 31 of the test target 10 are varied in the height direction, the variation of the contacts in the height direction of the electrode 12 can be absorbed by the slits 36, and thus, the electric characteristics of the test target can be tested more easily. Also, since the elastic member 40 has the saw-tooth portion 44 in which slits are formed corresponding to the slits 36 disposed in accordance with the contacts 31, the contacts 31 formed on the FPC 30 can be urged by the saw-tooth portions 44, the variation of the contacts in the height direction of the electrode 12 can be easily absorbed, and the electric characteristics of the test target can be tested still more easily. Also, the pressing force can be adjusted for each electrode by individually adjusting the slit length of the saw-tooth portion 44, and the electric characteristics of the test target electrodes with a plurality of materials can be tested still more easily. Furthermore, since the board wires 32 are electrically connected to the main body member 50 by the spring electrodes 34 having conductivity, as compared with those in which the board wires 32 and the main body member 50 are electrically connected by soldering, for example, replacement of the FPC 30 is easier, and thus, the electric characteristics of the test target 10 can be tested more easily. And since the elastic member 40 is fixed to the main body member 50 at the position offset from the contacts 31 with respect to the pressing direction as a fixed position, the contacts 31 are moved with offset with respect to the pressing direction, and the contacts 31 are brought into contact with the electrode 12 as the test target with the offset, the electric connection between the contacts and the electrode is further improved, and thus, the electric characteristics of the test target can be tested more easily. And also, since the elastic member 40 is a leaf spring fixed to the main body member 50 on the side different from the side to which the FPC 30 is electrically connected, the contacts 31 can be urged by the leaf spring with a relatively simple structure, and the electric characteristics of the test target can be tested more easily.

Also, since the contactor 20 is capable of electric connection and disconnection between the contacts 31 and the electrode 12 by the FPC 30 and the elastic member 40 as a leaf spring, a metal piece is hardly generated as compared with those sliding inside the main body member such as a plunger, for example, and more accurate tests can be conducted. Moreover, after repeated use, it is only necessary to replace the FPC 30 that can be manufactured relatively easily as a consumable supply, and the electric characteristics of the test target can be tested more easily.

It is needless to say that the present invention is not limited to the above-described embodiment but can be put into practice in various modes as long as it is within the technical range of the present invention. For convenience of explanation, the same reference numerals are given to the same configurations in the above-described configurations and the explanation will be omitted below.

For example, in the above-described embodiment, the electric connection between the contacts 31 and the first connection electrodes 53 is made by the FPC 30, but it is not particularly limited as long as the electric connection between the contacts 31 and the first connection electrodes 53 can be made.

In the above-described embodiment, the electric connection between the board wires 32 and the first connection electrodes 53 on the one end side of the FPC 30 is made by the fixing plate 38 and the spring electrodes 34, but a flat-plate shaped terminal may be used instead of the spring electrode 34, for example, or the board wires 32 and the first connection electrodes 53 may be soldered together. It is only necessary that the board wires 32 and the first connection electrodes 53 can be electrically connected. Also, the other end side of the FPC 30 is fixed by the fixing member 48, but it may be fixed by a screw instead of the fixing member 48 or may be bonded to the elastic member 40 by an adhesive. Also, the FPC 30 is fixed by the fixing plate 38 at a position closer to the contacts 31 in the elastic member 40 so that displacement between the saw-tooth portion 44 and the contact 31 is suppressed and the wiping effect is obtained, but not particularly limited to that, and the other end side of the FPC 30 may be fixed by the main body member 50, for example, or may be fixed to another fixing member disposed on the main body member 50 or the like.

In the above-described embodiment, the slits 36 are disposed adjacently to the contacts 31 on the FPC 30, but they may be omitted. Then, the variation in the height direction of the electrode 12 cannot be obtained easily, but a manufacturing process of the FPC 30 can be simplified. Also, the saw-tooth portions 44 are formed at the distal end of the elastic member 40, but they may be omitted. Then, the variation in the height direction of the electrode 12 cannot be obtained easily, but a manufacturing process of the elastic member can be simplified.

In the above-described embodiment, the elastic member 40 is fixed to the main body member 50 at a position offset from the contact 31 with respect to the pressing direction as a fixed position, but the elastic member 40 and the contacts 31 may be fired to the main body member 50 at the same positions with respect to the pressing direction as fixed positions. Then, the wiping effect by the contacts 31 cannot be obtained easily, but since the conductive member and the elastic member can be formed by separate materials and a combination of the urging force of the contact and conductivity can be set freely and more favorably, the electric characteristics of the test target can be tested more easily. The fired position of the elastic member 40 may be any position on the main body member 50 as long as the elastic member 40 can urge the contact 31 in the pressing direction.

Figure 6:
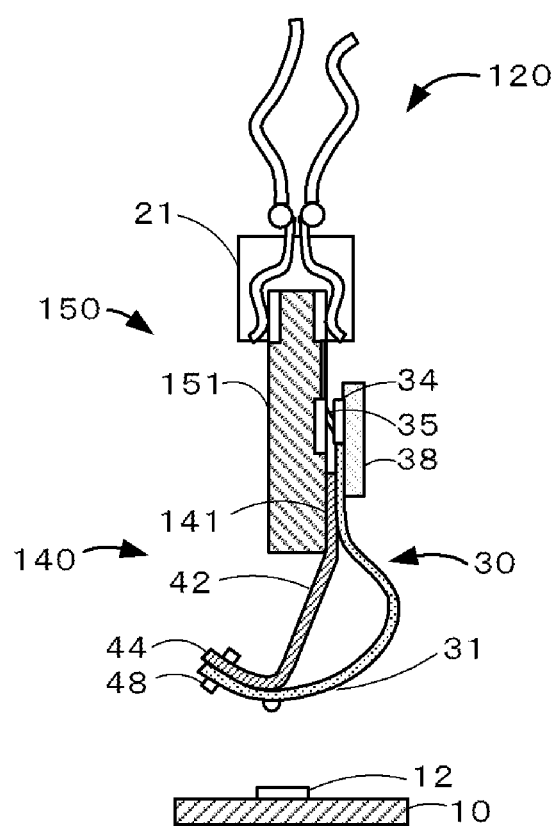
FIG. 6 is an explanatory diagram of a contactor 120.

In the above-described embodiment, the main body member 50 is provided with the main body board 51 that electrically connects the FPC 30 and the auxiliary board 52 that fixes the elastic member 40, but as shown as a contactor 120 in FIG. 6, it may be so configured that the FPC 30 is electrically connected and the elastic member 40 is fired to a single member. FIG. 6 is an explanatory diagram of the contactor 120. This contactor 120 is provided with a main body member 150 made up of a main body board 151 that electrically connects the FPC 30 and fixes an elastic member 140. Then, the number of components can be reduced so as to facilitate manufacture of the contactor 120, and then, the electric characteristics of the test target 10 can be tested more easily. In the above-described embodiment, the main body 50 is made up of two members but it may be made up of three or more members.

In the above-described embodiment, the elastic member 40 is a leaf spring fixed to the main body member 50 on the side different from the side to which the FPC 30 is electrically connected, but as shown in the contactor 120 in FIG. 6, it may be a leaf spring fixed to the main body member 150 on the same side as the side to which the FPC 30 is electrically connected. In this contactor 120, the elastic member 140 is fired in the vicinity of the fixed position of the FPC 30. Even then, the contacts 31 can be urged by a leaf spring, which has a relatively simple structure, and the electric characteristics of the test target can be tested more easily.

Figure 7:
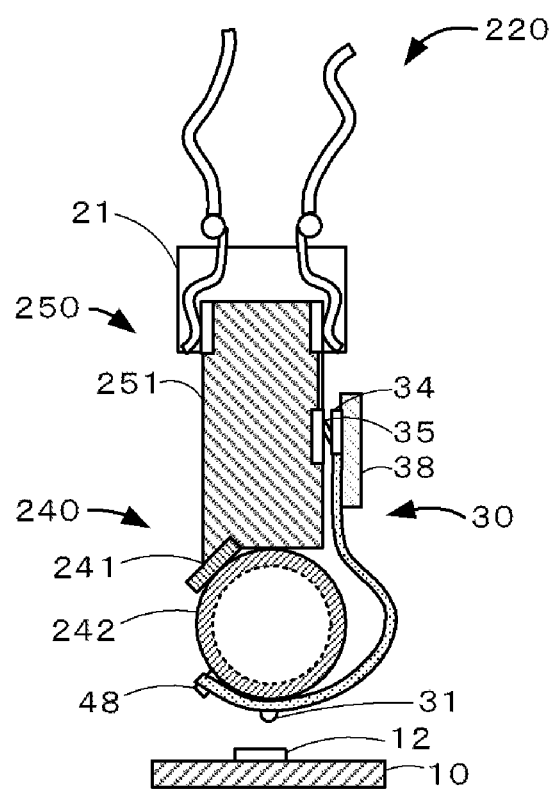
FIG. 7 is an explanatory diagram of a contactor 220.

In the above-described embodiment, the elastic member that urges the contacts 31 in the pressing direction is explained as a leaf spring, but it is not particularly limited as long as the contacts 31 can be urged in the pressing direction. For example, as shown in a contactor 220 in FIG. 7, it may be an elastic member 240, which is a hollow member that can contain a fluid. FIG. 7 is an explanatory diagram of the contactor 220. In this contactor 220, the one end side of the FPC 30 is electrically connected to a main body member 250 made up of a main body board 251, while a columnar elastic member 240 is fixed to the main body member 250 by a fixing portion 241. Also, the other end side of the FPC 30 is fixed to the surface of a cylinder portion 242 of the elastic member 240 by the fixing member 48. The elastic member 240 has the cylinder portion 242 formed into a cylindrically hollow portion by an elastic body (such as a resin, for example). The fluid contained in this elastic member 240 includes a gas such as air and nitrogen or a liquid such as water and oil. Also, electrical contact with the electrode 12 may be made by moving the contactor 220 in the pressing direction as it is or may be made by supplying a fluid into the cylinder portion 242 of the elastic member 240 by a pump or a tube, not shown, so as to make the elastic member 240 swollen (See FIG. 8, which will be described later). The elastic member 240 is preferably formed by a material that has not only an elasticity capable of giving a sufficient pressing force to the contact 31 but also flexibility to an extent that can absorb the variation in the height direction of the electrode 12. Even then, the conductive member and the elastic member can be formed by separate materials and a combination of the urging force of the contact and conductivity can be set freely and more favorably, and the electric characteristics of the test target can be tested more easily. Also, using the hollow member, the electric characteristics of the test target can be tested more easily with a relatively simple structure.

Figure 8:
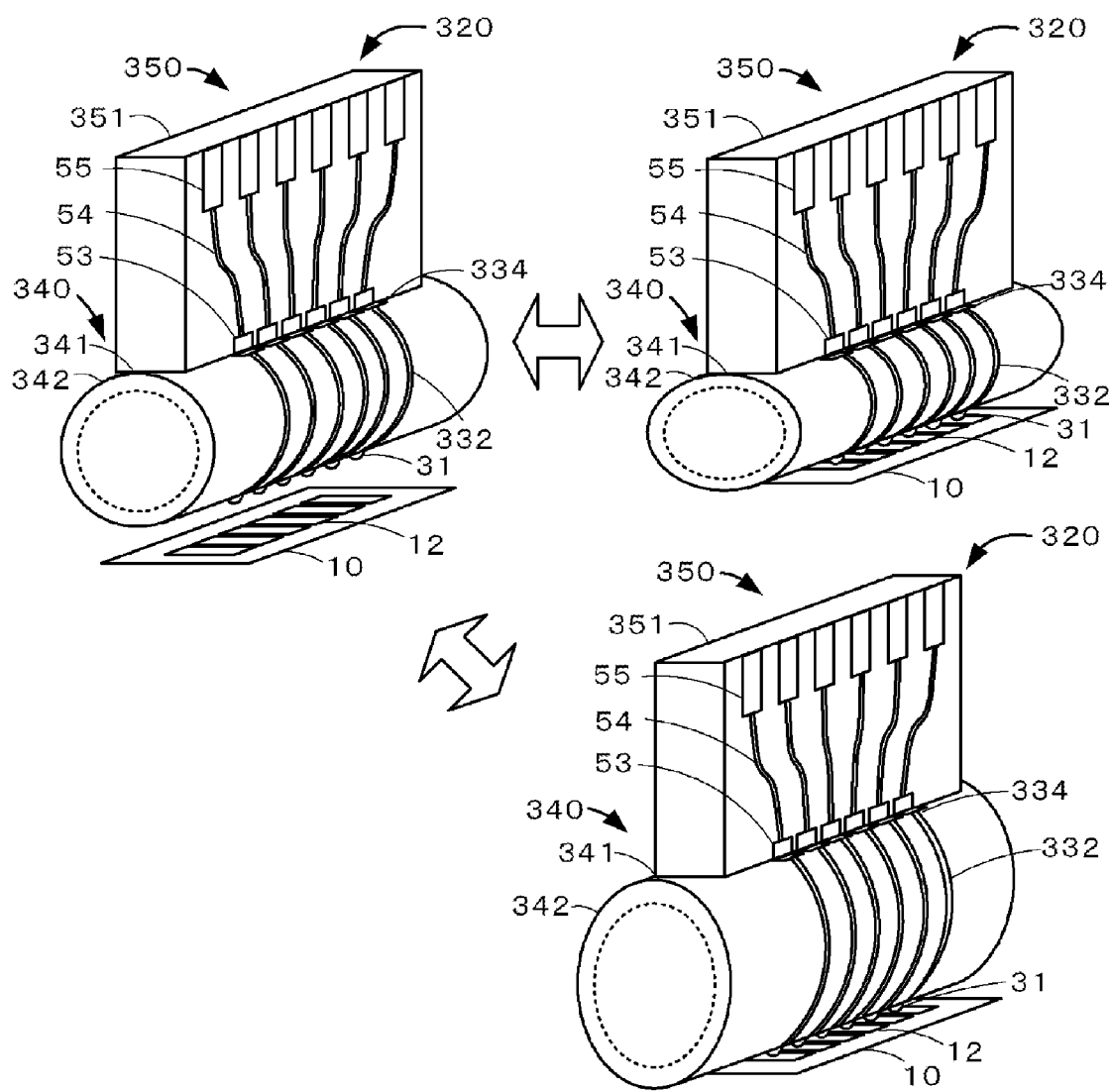
FIG. 8 is an explanatory diagram of a contactor 320.

The elastic member 240 of the contactor 220, which the FPC 30 is connected as shown in FIG. 7, may alternately be a contactor 320 as shown in FIG. 8, with board wires 332 formed on an elastic member 340. FIG. 8 is an explanatory diagram of the contactor 320. In this contactor 320, to a main body member 350 made up of a main body board 351, a hollow columnar elastic member 340 is fixed by a fixing portion 341. The elastic member 340 has a cylinder portion 342 formed into a cylindrically hollow portion by an elastic body (such as a resin, for example). Also, on this elastic member 340, the board wires 332 are directly formed, in which the contacts 31 are formed at one ends of the board wires 332, while spring electrodes 334 are connected to the other end of the board wires 332. The electrical contact with the electrode 12 may be made by moving the contactor 320 in the pressing direction as it is (upper right in FIG. 8) or may be made by supplying a fluid into the cylinder portion 342 of the elastic member 340 by a pump or a tube, not shown, so as to make the elastic member 340 swollen (lower right in FIG. 8). Then, the number of components can be further reduced, the contactor can be manufactured easily, and thus, the electric characteristics of the test target 10 can be tested more easily. In the contactors 220 and 320 of FIGS. 7 and 8, the elastic member 40 is a hollow member but it may be a solid member without a space inside as long as it can sufficiently urge the contacts 31.

In the embodiment shown in FIG. 1, the contacts 31 and the board wires 32 are formed in the number of six, but it is not particularly limited and they may be provided in the number according to the test target 10 as long as it is 1 or more.

In the above embodiment, the elastic member 40 is fixed in a state projecting to the outside of the housing of the auxiliary board 52 and the FPC 30 is electrically connected from the outside of the housing of the main body board 51, that is, the FPC 30 and the elastic member 40 are fixed to the outer face of the main body member 50, but it is not particularly limited and the FPC 30 may be electrically connected to the inside of the main body board 51 or the elastic member 40 may be fixed to the inside of the auxiliary board 52, for example.

The present application claims priority from Japanese Patent Application No. 2009-292642 filed on Dec. 24, 2009, the entire contents of which is incorporated herein by reference.

What is claimed is:
1. A contactor for testing a test target that is brought into contact with and separated from an electrode formed on the test target and tests electrical characteristics of an electric circuit having the electrode, comprising:
  one or more conductive members having a contact brought into contact with and separated from said electrode formed and having flexibility and conductivity;
  an elastic member that overlaps and is directly connected to said conductive member to form a U-shaped contact portion and to elastically urge the contact in a predetermined pressing direction; and
  a main body member to which said elastic member is fixed in a state projecting towards the outside of a housing of the main body member at a predetermined fixed position and to which said conductive member is electrically connected from outside of the housing;
  an electrically conductive spring electrode connecting one end of said conductive member to connection electrodes on said main body member, said spring electrode being fixed to said main body member by a fixing plate; and
  a fixing member connecting the other end of said conductive member to said elastic member,
  wherein said fixing plate and said fixing member are both removable.

2. The contactor according to claim 1, wherein said conductive member is formed on a wiring board having flexibility and said contact is formed on a test face, which is a face on the side where said test target is arranged; and
said elastic member overlaps with said conductive member on a face on the side opposite to said test face and urges the contact from the back side of said contact in said pressing direction.

3. The contactor according to claim 2, wherein said conductive member is formed on said wiring board having a slit portion disposed in accordance with said contact.

4. The contactor according to claim 3, wherein said elastic member is a spring having a saw-tooth portion in which slits are formed in accordance with the slit portion disposed in accordance with said contact.

5. The contactor according to claim 1, wherein said elastic member is fixed to said main body member at a position offset from said contact with respect to the pressing direction at said fixed position.

6. The contactor according to claim 1, wherein said elastic member is fixed to said main body member on a side different from a side to which said conductive member is electrically connected or is spring fixed to said main body member on the same side as the side to which said conductive member is electrically connected.

7. The contactor according to claim 1, wherein said elastic member is a hollow member that can contain a fluid.

8. The contactor according to claim 7, wherein said conductive member is a wire formed on a surface of said elastic member.

* * * * *